United States Patent [19]

Musseau et al.

[11] Patent Number: 4,839,586
[45] Date of Patent: Jun. 13, 1989

[54] APPARATUS FOR IRRADIATING ELECTRONIC CIRCUITS

[75] Inventors: Olivier Musseau, Longjumeau; Gerard Deschazeaux, Brunoy, both of France

[73] Assignee: Commissariat a l'Energie Atomique, Paris, France

[21] Appl. No.: 52,983

[22] Filed: May 22, 1987

[30] Foreign Application Priority Data

May 27, 1986 [FR] France .................. 86 07568

[51] Int. Cl.⁴ .................. G01R 31/28; G21K 5/10
[52] U.S. Cl. .................. 324/158 F; 250/492.2; 250/496.1
[58] Field of Search .................. 324/158 R, 158 F; 250/496.1, 497.1, 498.1, 492.2 R, 493.1, 506.1

[56] References Cited

U.S. PATENT DOCUMENTS 4,575,676  4/1983  Palkuti .................. 324/158 R

OTHER PUBLICATIONS

IEEE Transactions on Nuclear Science, vol. NS-28, No. 6, Dec. 1981, pp. 4022-4025.
Nuclear Instruments and Methods in Physics Research, vol. 191, No. 1-3, Dec. 1981, pp. 437-442.

*Primary Examiner*—Jerry Smith
*Assistant Examiner*—Stephen M. Baker
*Attorney, Agent, or Firm*—Nutter, McClennen & Fish

[57] ABSTRACT

An apparatus for irradiating electronic circuits, applicable to testing the electronic circuits subjected to cosmic radiation and also to the simulation of other radioactive surroundings, comprises: an evacuated radiation-tight enclosure; a moving carriage bearing a radioactive source; an ascensional plate bearing the circuit to be tested and a radiation detector; locking means preventing the enclosure from being demounted when the radioactive source is without a cover and radiates, such locking means preventing irradiation when the enclosure is not mounted, the position of the circuit being modifiable only when the radioactive source radiates, a panel continuously informing the operator of the state of the system and the operations to be performed.

10 Claims, 4 Drawing Sheets

APPARATUS FOR IRRADIATING ELECTRONIC CIRCUITS

DESCRIPTION

The invention relates to an apparatus for simulating radioactive surroundings for the purpose of studying the behaviour of electronic circuits subjected to radiation. The problem relates more particularly to the electronic circuits on board space shuttles and satellites subjected to cosmic radiations. The irradiation of the circuits may cause two harmful consequences: the bits may flip from logic level 0 to logic level 1 or vice versa, and short-circuits may be set up which may in the short term degrade the electronic circuits involved. It has therefore proved necessary to try out such circuits before they are actually used in space, and apparatuses have already been designed enabling this demand to be met.

BACKGROUND OF THE INVENTION

A first group of such apparatuses uses a particle accelerator and deflects a part of the beam on to the electronic circuit. However, the use of such apparatuses is complicated and heavy, so that irradiators have been constructed which are particularly adapted to this use. They mainly comprise an evacuated enclosure in which the circuit to be tested is placed, a dosimeter to characterize the radiation, and a radioactive source. One of them forms the subject matter of U.S. Pat. No. 4,575,676 in the name of Palkuti. The radiation source is a X-ray tube and logical safety devices are also provided which interrupt the emission of X-rays if a shutter and the evacuated enclosure are opened simultaneously. The irradiator requires the use of a microcomputer for this purpose. It also has the disadvantage of not ensuring circuit-radiation conditions which are equal to those measured by the dosimeter, since it mentions no means of positioning or precise control.

SUMMARY OF THE INVENTION

It is therefore an object of the invention to obviate these disadvantages and to provide an apparatus for irradiating electronic circuits whose controls are very simple and all disposed outside the evacuated enclosure, the irradiation conditions being unalterable during the test and similar to dosimeter calibration conditions, the apparatus having safety devices of a mainly mechanical nature which have the advantage of being very sure and prevent any possibility of an operator not aware of the risks involved being irradiated.

The invention therefore relates to an apparatus for electronic circuits, comprising: an evacuated irradiation-tight enclosure which can be demounted into at least two portions; a means for setting up the vacuum in the enclosure; a movable carriage bearing a radioactive source; an ascensional plate for positioning the electronic circuit to be tested; a radiation detector; and controls for moving the electronic circuit and the detector, such controls being connected to one of the portions of the evacuated enclosure and manipulated from outside the enclosure, wherein it also comprises a source-moving control which is connected to one of the portions of the evacuated enclosure and manipulated from outside such enclosure so as to move the source successively into a first non-irradiating position, a second detector-irradiating position and a third electronic-circuit-irradiating position, a means being provided for identifying the presence of the source in each of the three positions.

According to an important feature of the invention, the irradiation apparatus has a cover connected to the evacuated enclosure and preventing the source from emitting a radiation when the source is in a certain position. The apparatus also comprises a means for preventing irradiation when the enclosure is not assembled, and a means for preventing the enclosure from being demounted when the source emits a radiation. These means mainly comprise a movable electromagnet having two bolts which point in opposite directions and are adapted to block the evacuated enclosure in the assembled position and a device for retaining the control of the source in the non-irradiating position. The device comprises a link which is attached via one end to the base of the apparatus and has a rod adapted to receive the bolt at the other end of such link, the articulation between the link and the rod being used as a means for blocking such control.

According to an advantageous feature of the apparatus it also comprises a device enabling the control of the translation movement of the circuit and the radiation detector to be inactivated when the source emits a radiation.

BRIEF DESCRIPTION OF THE DRAWINGS

However, the invention will be more clearly understood from the following description of the purely illustrative, non-limitative accompanying drawings, wherein.

DETAILED DESCRIPTION OF THE PREFERRED EMBODIMENTS

Figure 1:
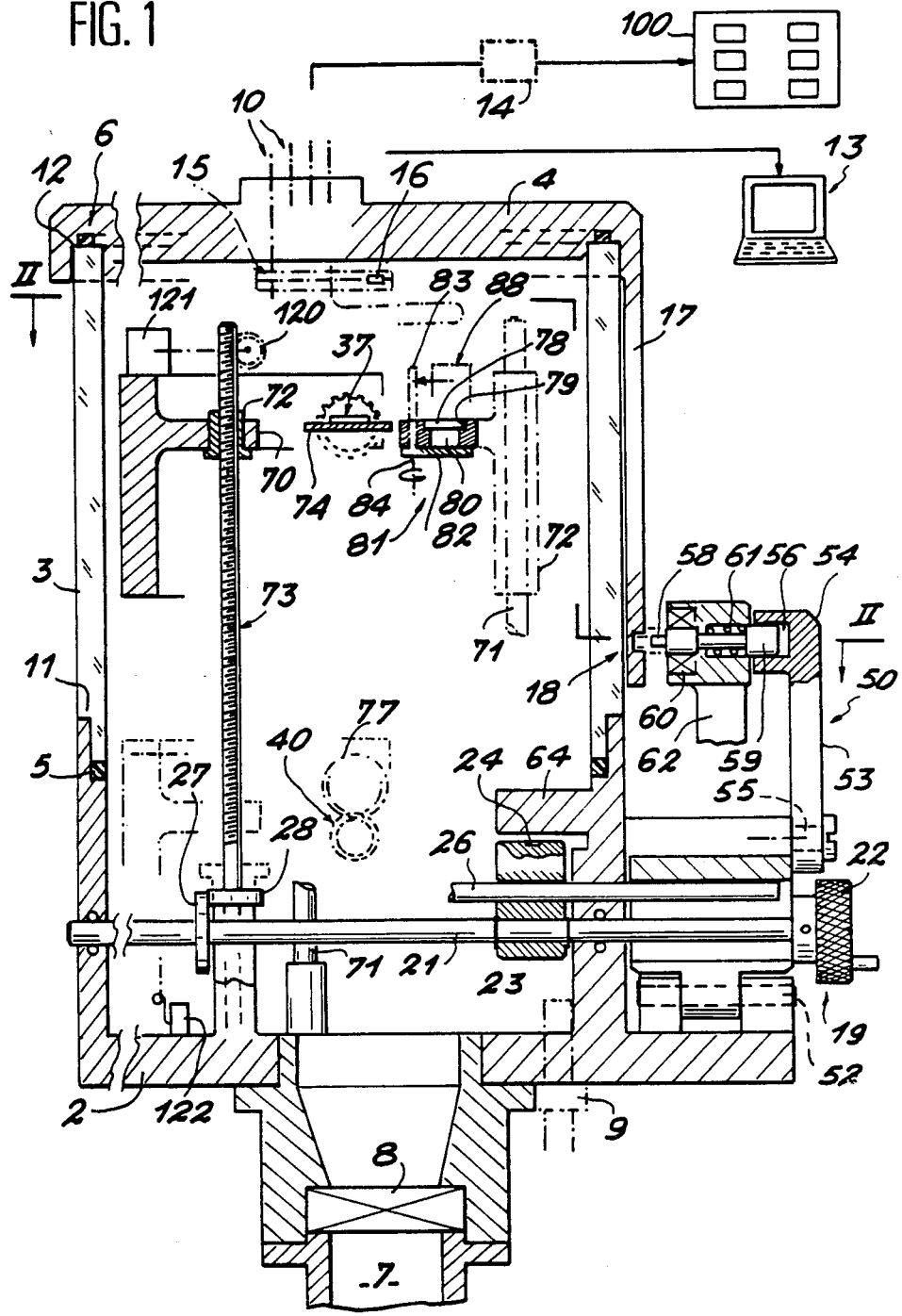
FIG. 1 is a front elevation of the invention in diametral section.

Referring to FIG. 1, therefore, the invention first comprises a generally cylindrical evacuated enclosure 1 comprising a base 2, a glass bell 3 and a cover 4; toric sealing joints ensure hermeticity, joint 5 being provided between the base 2 and the bell 3, and joint 6 between the bell 3 and the cover 4. The base 2 comprises a pumping means 7 conventionally comprising a pipe and a pump. It also comprises a filter 8 which prevents the entrainment of the radioactive particles with the gas sucked in if the radioactive source peels off. The base 2 also comprises a pressure pickup 9.

Figure 2:
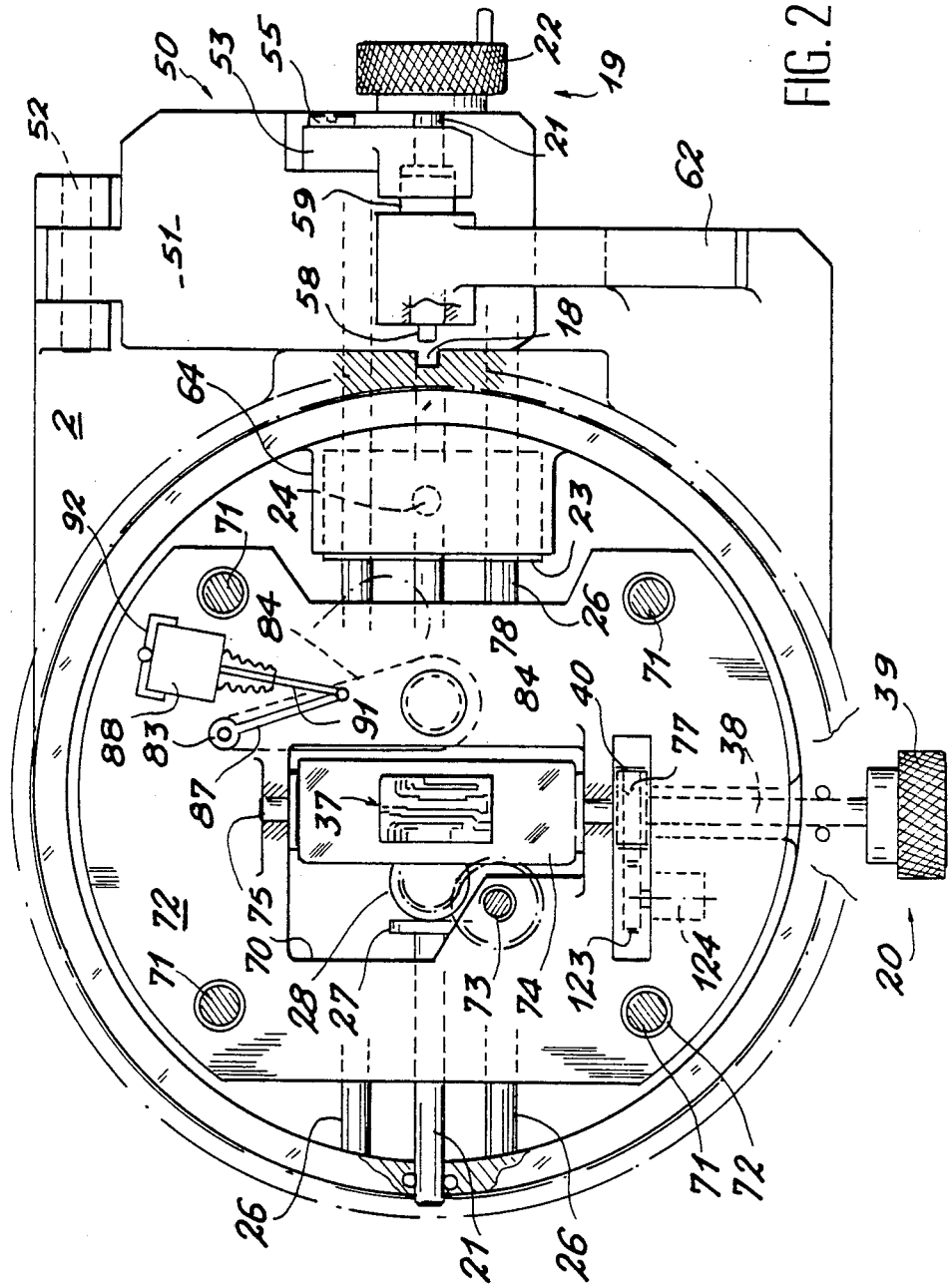
FIG. 2 is a plan view of the invention taken along the line II—II in FIG. 1.

The cover 4 comprises electric supply means 10: these both connect the pins of the electronic circuits to be tested to an electrical system 13 which enables the electronic circuit to be checked, for example, by a microcomputer, while they also connect various electric contacts to a wired logic network 14 (not shown in detail) whose objective is to supply information to the panel 100 (shown in greater detail in FIG. 5) and to perform certain functions for controlling the device which will be explained hereinafter. Two of the electric contacts are a contact 11 defining the closure of the bell 3 over the base 2, and a contact 12 defining the closure of the cover 4 on the bell 3. Another contact 16 ensures that the cables 10 have been properly connected when the cover 4 is assembled by the assembly of a connector 15. The cover 4 has a shoe 17 which descends along the glass bell 3, which is formed with an aperture 18 at its lower end. The apparatus also has a translation control 19 and a rotation control 20 (FIG. 2).

Figure 3:
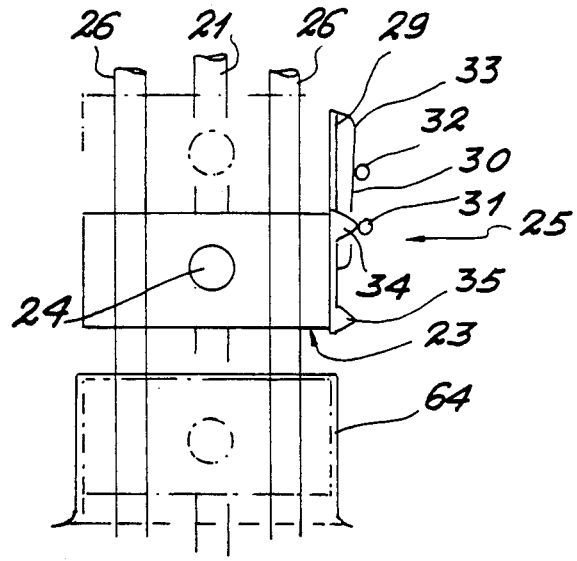
FIG. 3 is a plan view of the device bearing the radioactive source and the adjoining members.

The translation control 19 mainly comprises a rod 21 prolonged at its end by a handle 22. Disposed on the rod 21 is a carriage 23 which is inside the evacuated enclosure 1 and which carries a radioactive source 24 in practice taking the form of a lozenge. Disposed inside the evacuated enclosure 1 and also on the rod 21 is a wheel 27 which meshes with a pinion 28 to produce a turn through an angle of 90°. As shown more clearly in FIG. 3, the carriage 23 slides along two slides and also has a double cam 25 made up of an upper cam 29 and a lower cam 30. In dependence on the position of the carriage 23 the cams can close the electric contacts 31 and 32 respectively. To this end the lower cam 30 has a boss 33 enabling the irradiation of the inside of the evacuated enclosure 1 to be located, while the upper cam 29 has two bosses, the first of which 34 gives an indication that the radioactive source 24 is disposed below the radiation detector 78; the second boss 35 of the upper cam 29 indicates that the radioactive source 24 is disposed below the electronic circuit 37 to be tested.

The rotary control 20 comprises a rod 38 driven by a crank 39 disposed outside the evacuated enclosure 1; disposed at the end of the rod 38 inside the evacuated enclosure 1 is a toothed wheel 40.

Figure 4:
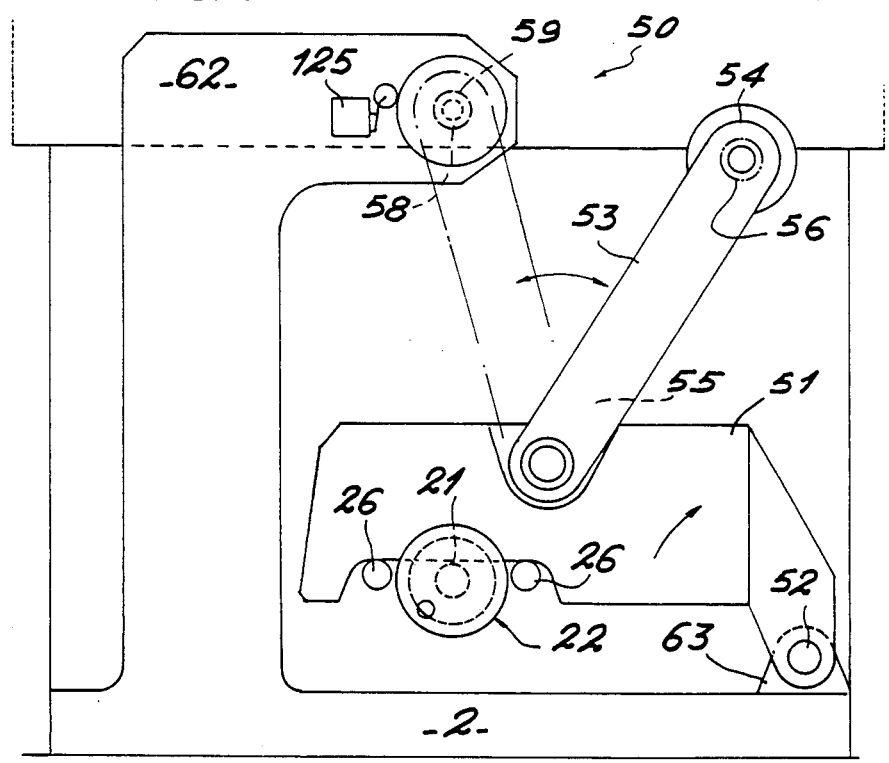
FIG. 4 is a side elevation of the device for locking the radioactive source in the non-irradiating position.

According to an important feature of the invention, associated with the translation control 19 is a blocking device 50 (shown in greater detail in FIG. 4) formed by a link 51 rotating around a pivot 52 disposed on a carrying structure 63 connected to the base 2, and a locking bar 53 articulated at one end to the link 51 via articulation 55 and having a bush 54 formed with a recess 56 at its other end; the blocking device 50 also comprises, mounted on a retaining structure 62 connected to the base 2, an assembly formed by an electromagnet 60 and two bolts pointing in opposite directions; one 59 of the bolts blocks the link 51 and the locking bar 53 by being inserted in the recess 56 thereof, while the other bolt 58 is disposed opposite the aperture 18 in the shoe 17 of the cover 4 and can be inserted thereinto as a result of the displacement of the electromagnet 60 following its energization. This configuration is shown in chain-dot lines in FIG. 1. It can therefore be seen that the bolt 59 no longer blocks the locking bar 53, so that the bar 53 and the link 51 can move.

A spring 61 operates by tension and therefore allows the return and retention of the electromagnet 60 on the wall of the supporting structure 62 when the electromagnet is not energized.

Disposed inside the evacuated enclosure 1 is an ascensional plate 70 supporting the electronic circuit 37 and a radiation detector 78. The plate 70 can move vertically along columns 71 to which it is connected via rings 72. One of the columns is formed by an endless screw 73 whose rotation, controlled by the wheel 27 and pinion 28, moves the plate 70. The ring 72 associated with the endless screw 73 is tapped accordingly along its inner surface.

The electronic circuit 37 is disposed on a suitable circuit carrier ensuring the electrical connections. The support 74 can be inclined around a spindle 75 connected to a toothed wheel 77 adapted to mesh with the toothed wheel 40, as shown in FIG. 2.

In one advantageous embodiment of the invention the centre of the electronic circuit 37 is so placed on the spindle 75 that its rotation does not change its overall distance in relation to the radioactive source 24.

The radiation detector 78 is preferably disposed in a recess 79 countersunk in the plate 70. A hole 80 is provided below the measuring surface of the detector which can be concealed by the surface 82 of a closure element 81 whose handle 83 extends through a passage 84 bored in the plate 70. A helical spring (not shown) retains the closure member 81 in the position shown in FIG. 1 - i.e., in such a way as to mask the detector 78. Its opening can be controlled by an electromagnet 88 whose energization pulls a strip 91 attached thereto and therefore rotates the closure member 81 via a nipple 87 attached to its handle 83. The electromagnet is disposed on a retaining structure 92 which is attached to the plated and can moreover, in one advantageous embodiment of the invention, be curved at the top to provide a protective hood.

Figure 5:
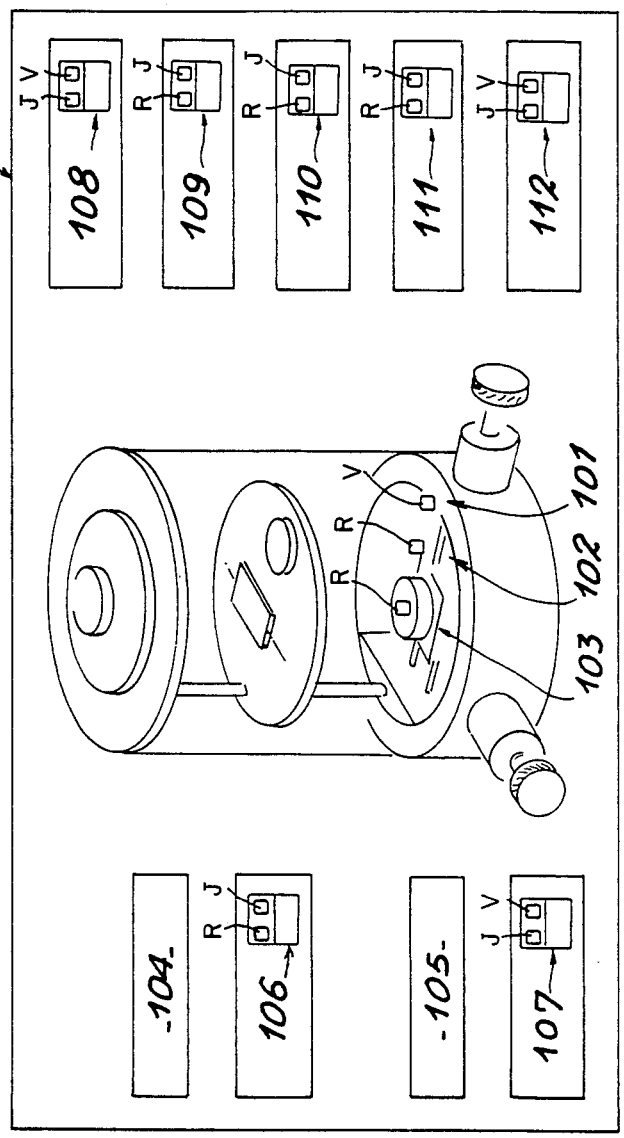
FIG. 5 shows the panel indicating the state of the system and the sequence of operations to be performed.

The panel 100 (shown in greater detail in FIG. 5) is connected to a wired logic network 14. It comprises various red, yellow and green light indicators (references R, J and V in FIG. 5). Three of the indicators are isolated on the panel 100: the green indicator 101, the red indicator 102 and the red indicator 103 identify three particular positions of the radioactive source 24: non-irradiating, beneath the detector 78, beneath the circuit 37. They can be indicated as suggested on the diagram (FIG. 5). The other light indicators are associated in pairs on push buttons: three of them 107, 108 and 112 have a yellow indicator and a green indicator and are associated respectively with the rotation of the circuit 37, the connector 15 and the translation of the circuit 37. The four other indicators 106, 109, 110 and 111 have a red signal and a yellow signal and are associated respectively with the irradiation of the circuit 37, the detector 78, the operation of the detector and the translation of the radioactive source 24.

The control panel 100 also comprises two digital displays 104 and 105 indicating the angle of inclination of the circuit 37 and the vertical projection of its distance from the source 24. Except for the three isolated indicators 101, 102, 103, when the green indicators are lit it means in general that an operation is immediately possible without any risk of irradiation; when the red indicators are lit it means that an operation is performed under irradiation, the yellow indicators when lit indicating that the corresponding operation is possible or must be performed to obtain a state desired by the user. In the first case the panel 100 is used in the descriptional mode and the indicators are used to indicate the state of the system at any moment. In the second case, the user operates in the instructional mode and presses the push button 106 to 112 corresponding to the operation which he wishes to perform; the panel 100 then shows him the maneuvers to be performed successively by the lighting up in sequence of the yellow indicators corresponding to such maneuvers. This is therefore a genuine interacting system, forming one of the original features of the invention. The logic means for performing these interacting functions, shown diagramatically in FIG. 1 by the wired logic network 14, are however easy to produce by any one versed in the corresponding technique, and will not be described in detail here. An example of the use of this instructional mode will be given after describing in greater detail the performance of an irradiation test and the repercussions of the operations performed in turn on the panel 100, which is supposed to be operating in the descriptional mode.

The first task is to place the electronic circuit 37 for testing on the ascensional plate 70 and connect its pins to the connecting wires 10. In one embodiment of the invention, the number of wires available for this purpose is forty, but adaptations can be envisaged which would comprise a larger number of available wires without affecting the basic principles of the invention.

Next the evacuated enclosure 1 is mounted by positioning the bell 3 on the base 2 and then the cover 4 on the bell 3, after connecting the wires 10 to the connector 15; the pins of the circuit 37 are then connected to the checking machine 13; the electric contacts 31 and 32 are connected to the wired logic network 14 and are therefore in a condition to be used. The configuration of the mechanical members is then as follows: the radioactive source 24 is blocked against the inner wall of the evacuated enclosure 1 and covered by a cover 64 which stops the radiation of the source 24, which is in the "parked" position. However, it can be brought out of this, since the electromagnet has been energized by the simultaneous closure of the contacts 11 between the base 2 and the bell 3 and the contacts 12 between the bell 3 and the cover 4, and also by the closure of the contacts 16, which shows that the cables 10 have been connected to the connector 15. Then the bolt 58 is in operation and prevents the demounting of the cover 4 by being inserted in the aperture 18.

The cover 64 and the closure member 81 must be thick enough to play a protective role. In the case of simulation of cosmic radiation, the radioactivity to be reproduced is relatively low and a thickness of 2 mm of steel is suitable for the californium$^{252}$ lozenges commercially available.

Then the following indicators are lit:
- the green indicator 108 ensuring that the electrical connections have bene made and the source 24 is parked;
- the green indicator 101 which shows that the source 24 has been parked, and the yellow indicator 111;
- the green indicator 112 which indicates that the plate 70 can be translated vertically.

The plate 70 is then brought down by turning the handle 22 which drives the wheel 27 and pinion 28 which are in contact for this precise position of the source 24. The endless screw 73 allows the descent of the plate 72, and also the rotation of a toothed wheel 120 connected to a potentiometer 121 which shows the level of the circuit 37 in relation to the source 24 on the digital display 104.

When the plate 70 is in the bottom position, the green light 107 lights up by the operation of a contact 122, indicating that the circuit 37 can be rotated, since in this position the toothed wheels 40 and 77 mesh and use can be made of the rotary control 20 of the circuit 37. The toothed wheel 77 is also connected to another toothed wheel 123 connected to a potentiometer 124 whose condition is shown by the digital display 105 of the angle of inclination of the circuit 37.

After the angle of inclination has been regulated, the plate 70 can be taken up back to the required height to correctly simulated the required level of irradiation. The green light 107 associated with the rotation of the circuit is extinguished.

The following stage consists in bringing the radioactive source 24 out. To this end the locking bar 53 is tilted along the link 51, which is then pivoted around its pivot 52. The translation control 19 is then released and the handle 22 can be pushed. There is no longer any contact between the wheel 27 and the pinion 28, so that the circuit can no longer be moved and the test conditions cannot be misadjusted.

As soon as the radioactive source 24 comes out, the boss 33 of the lower cam 30 closes a contact 32 which extinguishes the green indicators 101, 108 and 112, replaces the yellow indicator 111 with the red indicator and lights up the red indicators 102 and 103, which show that the source 24 has emerged and is radiating. This situation continues until the boss 34 of the upper cam 29 closes the contact 31: then the red indicator 103 is extinguished and the red indicator 109 lights up, showing that the radioactive source 24 is just below the detector 78 and therefore in a position to irradiate the latter correctly, and that the closure member 81 can be removed, something which is done by pushing the button 110 whose red indicator then lights up.

When it is thought that the detector 78 has been irradiated sufficiently to calibrate the source 24, the closure member 81 is reclosed by pressing the button 110 again and the source 24 is again pushed using the handle 22. The contact 31 opens and the panel 110 shows the same appearance as before the contact 31 passed over the boss 34. This situation lasts until the contact 31 is closed via the boss 35: at the same moment the lower cam 30 is interrupted and the corresponding contact 32 opens: the radioactive source 24 is just below the electronic circuit 37 for irradiation; the panel 100 then shows the red indicators 103, 106 and 111 lit up, indicating that the circuit is irradiated in the intended conditions and that the radioactive source 24 has come out properly; this redundancy of information is justified for safety reasons.

The system is left in this condition for the time necessary to perform the required simulation, whereafter the source 24 is bent back into its parked position under the cover 64: the control panel 100 then shows the green indicators 101, 108 and 112 lit up, indicating respectively that the source 24 is parked, that the source 24 is parked and the connecting cables 10 correctly connected, and that the plate 70 can again be displaced vertically.

To demount the system, the link 51 and the locking rod 53 are unfolded: when the articulation 55 blocks the translation control 20 and the recess 56 is opposite the bolt 59, a contact 125 closes and renders the electromagnet 60 inoperative, which the spring 61 returns into abutment with the wall of the supporting structure 62. The bolt 59 enters the recess 56, while the bolt 58 releases the hole 18; then the evacuated enclosure can be demounted without risk, since the source 24 is parked, as shown by the illuminated yellow indicator 108 and green indicator 101 respectively.

Of course, the pressures must be equalized. Preferably use is made of a nitrogen circuit (not shown) which creates a gaseous medium cleaner than the ambient air. The enclosure 1 can then be demounted.

If the user is as yet unaware of the order of operations needed to produce a particular state of the system, he can use the panel 100 in the instructional mode. The push buttons 106 to 112 with their yellow indicators are partly provided for this purpose.

EXAMPLE 1

Starting from the assembly of the evacuated enclosure 1, the user wishes to irradiate the circuit 37. He therefore presses the corresponding button 106 and the yellow indicator 111 shows him that he can bring the source out. He performs this movement until the radioactive source 24 is below the circuit 37, when the yellow indicator 111 is extinguished and replaced by the yellow indicator 106, which indicates that the required change of state has taken place.

EXAMPLE 2

Starting from this state of irradiation of the circuit 37, the user wishes to perform an irradiation measurement, using the detector 78. He presses the button 110; the yellow indicator 111 lights up and shows him that he must move the source 24. When the source 24 is just below the detector 78, the yellow indicator 111 is extinguished and the yellow indicator 110 lights up, indicating that the closure member 81 can be opened.

EXAMPLE 3

Starting from the irradiation of the circuit 37, the user now wishes to correct the angle of inclination of the circuit. He therefore presses the button 107. The yellow indicator 111 lights up and shows him that he must move the source 24. When the source is parked, the yellow indicator 111 is replaced by the yellow indicator 112, showing that the plate 70 must be lowered to the bottom position; when this has been done, the toothed wheels 40 and 77 are in contact and the circuit 37 can be rotated; then the yellow indicator 107 corresponding to the required function lights up.

EXAMPLE 4

Starting from this state, the system is to be demounted. The operator presses on the button 108. The yellow indicator 111 lights up and remains lit until the source has been parked and the translation control 20 blocked by the bolt 59, as described hereinbefore; the yellow indicator 108 then lights up and signals that the demounting of the evacuated enclosure 1 can start.

For these different Examples the red and green indicators light up as described hereinbefore; their conditions of use remain unaffected.

The irradiation-simulating apparatus disclosed hereinbefore therefore has certain advantages over the apparatuses of the same family which are already commercially available: the position of the electronic circuit 37 for testing and of the radioactive source 24 can be adjusted in a simpler manner, since the former only requires a vertical translation movement (and a rotation, if necessary), while the latter requires a horizontal translation movement; the radiation detector 78 is constrainedly irradiation in the same conditions as the electronic circuit 37 to which it is connected; moreover, the mechanical design selected ensures that the operations of performing a test follow one another in a clearly-defined order, thus limiting the risks of error and above all providing total radiological protection; lastly, the panel is adapted to constantly assist the operator by its descriptional mode indicating the state of the system and its instructional mode of operation, which forms a genuine guide to the operations to be performed.

The apparatus is mainly designed for testing electronic circuits subjected to cosmic radiation, but it can be expanded to the reproduction of radiations having a different energy distribution spectrum. For this it is enough to have the appropriate radioactive source. Moreover, the radiation spectra emitted can be appreciably modified if a residual pressure is maintained in the enclosure; this is another parameter which can be brought into play.

The apparatus is therefore not limited to irradiation by californium$^{252}$, even though that radioactive element is the one most frequently used for the simulation of cosmic radiation.

What is claimed is:

1. An irradiation apparatus for electronic circuits comprising: an evacuated irradiation-tight enclosure which can be demounted into at least two portions; a means for setting up the vacuum in the enclosure; a movable carriage bearing a radioactive source; an ascensional plate for positioning the electronic circuit to be tested; a radiation detector; and controls for moving the electronic circuit and the detector, such controls being connected to one of the portions of the evacuated enclosure and manipulated from outside the enclosure; a source-moving control which is connected to one of the portions of the evacuated enclosure and manipulated from outside such enclosure so as to move the source successively into a first position wherein the source does not irradiate either said detector or said electronic circuit, a second detector-irradiating position and a third electronic circuit-irradiating position, means being provided for identifying the presence of the source in each of the three positions; mechanical blocking means which both prevents radiation when the enclosure is not assembled; and which prevents the enclosure from being demounted when the source is not in its said first position.

2. An irradiation apparatus according to claim 1, wherein said radioactive source which disintegrates by spontaneous fission.

3. An irradiation apparatus according to claim 2, wherein said radioactive source is composed of californium$^{252}$.

4. An irradiation apparatus according to claim 1, including a cover connected to the evacuated enclosure which prevents the source from emitting a radiation for a certain position of such source.

5. An irradiation-simulating apparatus according to claim 1 wherein said preventing means comprise a movable electromagnet having two bolts pointing in opposite directions and adapted to block the enclosure in the assembled position and a device for retaining the control of the source in the non-irradiating position respectively.

6. An irradiation apparatus according to claim 5 wherein the device for retaining the control of the source in the non-irradiating position comprises a link which is attached via one end to the base of the apparatus and has a rod adapted to receive the bolt at the other end of such link, the articulation between the link and the rod being used as a means for blocking such control.

7. An irradiation apparatus according to claim 1, including a means for closing the radiation detector when the source is not positioned so as to irradiate the detector correctly.

8. An irradiation apparatus according to claim 7 including a device enabling the control of the translation movement of the circuit and the radiation detector to be inactivated when the source emits a radiation.

9. An irradiation apparatus according to claim 8, wherein the device enabling the control of the movement of the circuit and of the radiation detector to be inactivated when the source emits a radiation is formed by an ascensional plate supporting the electronic circuit and detector and a wheel connected to the source and adapted to mesh with a pinion rotating an endless screw which moves the ascensional plate vertically between top and bottom positions.

10. An irradiation apparatus according to claim 8, wherein said device enabling control comprises means made up of two toothed wheels which are in contact and thus enable the circuit to be rotated only when the ascensional plate supporting the circuit is in the bottom position.

* * * * *